US012803549B2

(12) United States Patent
Chen et al.

(10) Patent No.: US 12,803,549 B2
(45) Date of Patent: Nov. 17, 2026

(54) DYNAMIC TWO-STEP GATE DRIVER CIRCUIT FOR POWER SEMICONDUCTOR DEVICE

(71) Applicant: The Hong Kong University of Science and Technology, Hong Kong (CN)

(72) Inventors: Jing Chen, Hong Kong (CN); Ji Shu, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 94 days.

(21) Appl. No.: 19/021,244

(22) Filed: Jan. 15, 2025

(65) Prior Publication Data

US 2025/0364981 A1 Nov. 27, 2025

Related U.S. Application Data

(60) Provisional application No. 63/651,401, filed on May 24, 2024.

(51) Int. Cl.

| | |
|---|---|
| ***H03K 17/0814*** | (2006.01) |
| ***H02M 1/08*** | (2006.01) |
| ***H03K 17/081*** | (2006.01) |

(52) U.S. Cl.

CPC ........ *H03K 17/08104* (2013.01); *H02M 1/08* (2013.01)

(58) Field of Classification Search

CPC ........................... H03K 17/08104; H02M 1/08

See application file for complete search history.

(56) References Cited

U.S. PATENT DOCUMENTS 9,882,553 B2 1/2018 Kwan et al.
10,536,070 B1 * 1/2020 Penzo .................... H02M 1/08

(Continued)

FOREIGN PATENT DOCUMENTS

CH 711457 A2 2/2017
CN 117879326 A 4/2024

(Continued)

OTHER PUBLICATIONS

K. J. Chen et al., “GaN-on-Si Power Technology: Devices and Applications,” IEEE Transactions on Electron Devices, vol. 64, No. 3, pp. 779-795, 2017.

(Continued)

*Primary Examiner* — Daniel C Puentes
(74) *Attorney, Agent, or Firm* — IDEA Intellectual Limited; Sam T. Yip

(57) ABSTRACT

A dynamic two-step gate driver circuit includes a power device, a driver IC, a first gate turn-on resistor, a gate turn-off resistor, and a gate protection sub-circuit. The power device operates as a high-speed switching component. The driver IC generates gate drive signals to control the power device’s switching and has gate turn-on and gate turn-off terminals. The first gate turn-on resistor connects the driver IC’s gate turn-on terminal to the power device’s gate terminal, while the gate turn-off resistor connects the gate turn-off terminal to the gate terminal. The gate protection sub-circuit, connected between the first gate turn-on resistor and the gate terminal, includes a diode and a second gate turn-on resistor to regulate the gate voltage. The diode’s anode connects to the first gate turn-on resistor, while its cathode and the second resistor are in parallel with the power device’s gate terminal.

18 Claims, 12 Drawing Sheets

(56) References Cited

U.S. PATENT DOCUMENTS

| | | | | |
|---|---|---|---|---|
| 2019/0273491 | A1 * | 9/2019 | Hu | H03K 17/04106 |
| 2020/0126962 | A1 | 4/2020 | Kono | |
| 2025/0266826 | A1 * | 8/2025 | Udrea | H03K 17/567 |

FOREIGN PATENT DOCUMENTS

| | | | | | |
|---|---|---|---|---|---|
| JP | 201479086 | A | | 5/2014 | |
| KR | 20230103987 | A | * | 7/2023 | H03K 17/165 |

OTHER PUBLICATIONS

J. Shu, J. Sun, Z. Zheng, and K. J. Chen, "Protecting SiC JFET from Gate Overstress in GaN/SiC Cascode Device without Compromising Switching Performance," IEEE Transactions on Power Electronics, pp. 1-9, 2024.

W. J. Zhang et al., "A Smart Gate Driver IC for GaN Power HEMTs with Dynamic Ringing Suppression," IEEE Transactions on Power Electronics, pp. 14119-14132, 2021.

J. Balcells et al., "Effect of driver to gate coupling circuits on EMI produced by SiC MOSFETS," 2013 International Symposium on Electromagnetic Compatibility, 2013.

* cited by examiner

100

100

DYNAMIC TWO-STEP GATE DRIVER CIRCUIT FOR POWER SEMICONDUCTOR DEVICE

TECHNICAL FIELD

The present invention relates to power semiconductor device technology, particularly to a dynamic two-step gate driver circuit for power semiconductor devices.

BACKGROUND

Compared with silicon-based devices, power devices based on wide-bandgap (WBG) semiconductors of gallium nitride (GaN) are suitable for the next generation high-efficiency and high-power-density converters, mainly owing to their superior properties, such as higher operation temperature, faster switching speed, and lower specific on-resistance.

At present, GaN enhancement-mode (E-mode) high-electron-mobility transistors (HEMTs) have been widely available and commercialized with products available at both low- and medium-voltage levels ranging from 15 V to 650 V. Recently, a new HV cascode GaN/SiC device combining the merits of a low-voltage (LV) E-mode GaN HEMT and an HV D-mode SiC JFET has been proposed. The new cascode GaN/SiC power device demonstrated the benefits of fast switching speed, high operating temperature, thermally stable threshold voltage (VTH), and most importantly, zero reverse-recovery charge (Qrr).

However, designing suitable gate driver circuit for GaN HEMT to unlock the full fast-switching potential of GaN HEMT can be challenging. FIG. 1 shows the configuration of the conventional gate driver circuit. Due to the unusual gate stack of GaN HEMT, the maximum gate driving voltage is around 6V-7V, which is substantially lower than traditional Si MOSFET. Meanwhile, to suppress the dynamic on-resistance increase, a high gate driving voltage of 5V-6V is recommended. Such a narrow gate voltage margin (e.g., less than 1V) causes the gate voltage oscillation to exceed the maximum gate voltage limit during fast switching transients, leading to gate overvoltage and gate reliability issues.

To unlock the fast-switching potential of GaN HEMT without overstressing the gate, the prior art suppresses the gate overshoot with segmented gate driver IC that can provide a dynamic gate resistance during the switching transient. However, the complicated programming and timing can increase the complexity of the driver circuit.

Therefore, there is a need for a simplified and effective gate driver circuit that can unlock the fast-switching potential of GaN HEMTs while addressing gate overstress and reliability issues caused by narrow voltage margins during switching transients.

SUMMARY OF INVENTION

It is an objective of the present invention to provide an apparatus and a method to address the aforementioned shortcomings and unmet needs in the state of the art.

In accordance with a first aspect of the present invention, a dynamic two-step gate driver circuit is provided. The dynamic two-step gate driver circuit includes a power device, a driver integrated circuit (IC), a first gate turn-on resistor, a gate turn-off resistor, and a gate protection sub-circuit. The power device functions as a high-speed switching component and has a gate terminal, a source terminal, and a drain terminal. The driver IC is configured to generate a gate drive signal and transmit it to control a switching process of the power device and has a gate turn-on terminal and a gate turn-off terminal. The first gate turn-on resistor is electrically connected between the gate turn-on terminal of the driver IC and the gate terminal of the power device. The gate turn-off resistor is electrically connected between the gate turn-off terminal of the driver IC and the gate terminal of the power device. The gate protection sub-circuit is electrically connected between the first gate turn-on resistor and the gate terminal of the power device. The gate protection sub-circuit includes a diode and a second gate turn-on resistor for controlling a gate voltage of the power device during a turn-on process. The diode has an anode electrically connected to the first gate turn-on resistor and a cathode electrically connected to the gate terminal of the power device and it is connected in parallel with the second gate turn-on resistor.

In some embodiments, the diode, the second gate turn-on resistor, and the power device collectively form a monolithically integration structure.

In accordance with a second aspect of the present invention, a dynamic two-step gate driver circuit is provided. The dynamic two-step gate driver circuit includes a power device, a driver IC, a first gate turn-on resistor, a gate turn-off resistor, and a gate protection sub-circuit. The power device functions as a high-speed switching component and has a gate terminal, a source terminal, and a drain terminal. The driver IC is configured to generate a gate drive signal and transmit it to control a switching process of the power device and has a gate turn-on terminal and a gate turn-off terminal. The first gate turn-on resistor is electrically connected between the gate turn-on terminal of the driver IC and the gate terminal of the power device. The gate turn-off resistor is electrically connected between the gate turn-off terminal of the driver IC and the gate terminal of the power device. The gate protection sub-circuit is electrically connected between the gate turn-on terminal of the driver IC and the first gate turn-on resistor. The gate protection sub-circuit includes a diode and a second gate turn-on resistor for controlling a gate voltage of the power device during a turn-on process. The diode has an anode electrically connected to the gate turn-on terminal of the driver IC and a cathode electrically connected to the first gate turn-on resistor, and the diode is connected in parallel with the second gate turn-on resistor.

In some embodiments, the diode, the second gate turn-on resistor, and the driver IC collectively form a monolithically integration structure with a shared substrate.

With this configuration, the present invention provides a solution to protect the GaN HEMT from gate overstress caused by gate voltage overshoot, without compromising the device's switching speed. The proposed novel driver design adds a diode between the turn-on gate resistor (RG-ON) and the gate electrode of the GaN HEMT. During the turn-on process, the forward conduction of the diode can generate a voltage drop on the diode. This voltage drop can reduce the gate turn-on voltage of the GaN HEMT, thereby, the margin to the maximum allowable gate voltage is widened. As a result, a small gate resistance RG-ox can be used in the first turn-on stage for fast switching speed, as gate voltage ringing can be accommodated in the widened gate voltage margin. After the first fast-switching stage, the driver circuit enters the second turn-on stage, where the gate voltage of GaN HEMT is elevated to a higher value so as to reduce the conduction loss of power devices and suppress the increase of dynamic on-resistance. During the second turn-on stage, a large gate resistance is used for suppressing the gate overshoot and the associated gate overstress issues.

Accordingly, such a dynamic two-step turn-on process maintains both the switching speed and gate reliability of the power device. Moreover, the on-state gate voltage can be elevated to a higher value to reduce the conduction loss of the power device.

BRIEF DESCRIPTION OF DRAWINGS

Embodiments of the invention are described in more details hereinafter with reference to the drawings, in which.

DETAILED DESCRIPTION OF THE INVENTION

In the following description, a dynamic two-step gate driver circuit for power semiconductor devices and the likes are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 1:
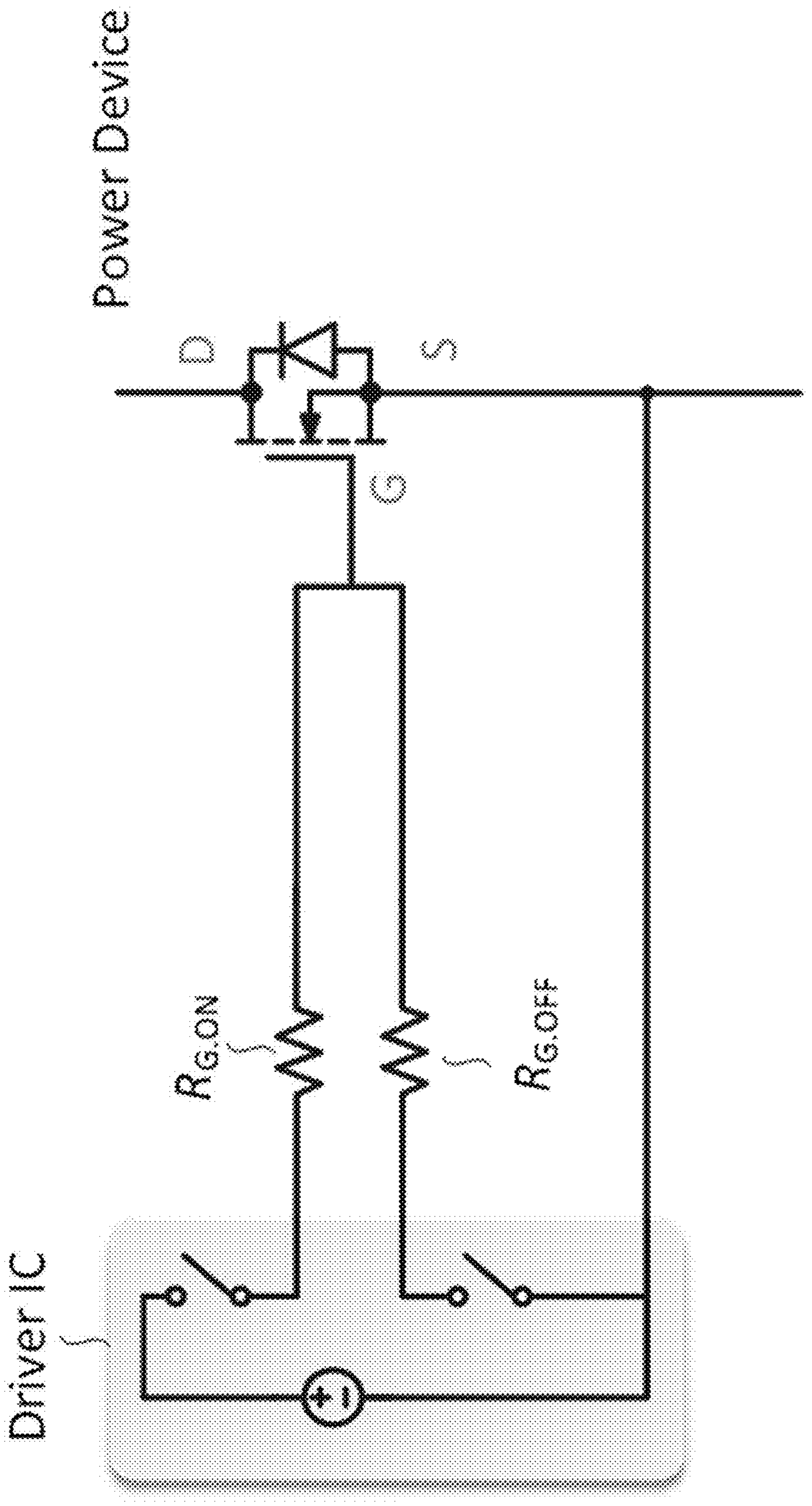
FIG. 1 shows a schematic drawing of a configuration of a conventional gate driver circuit.
Figure 2:
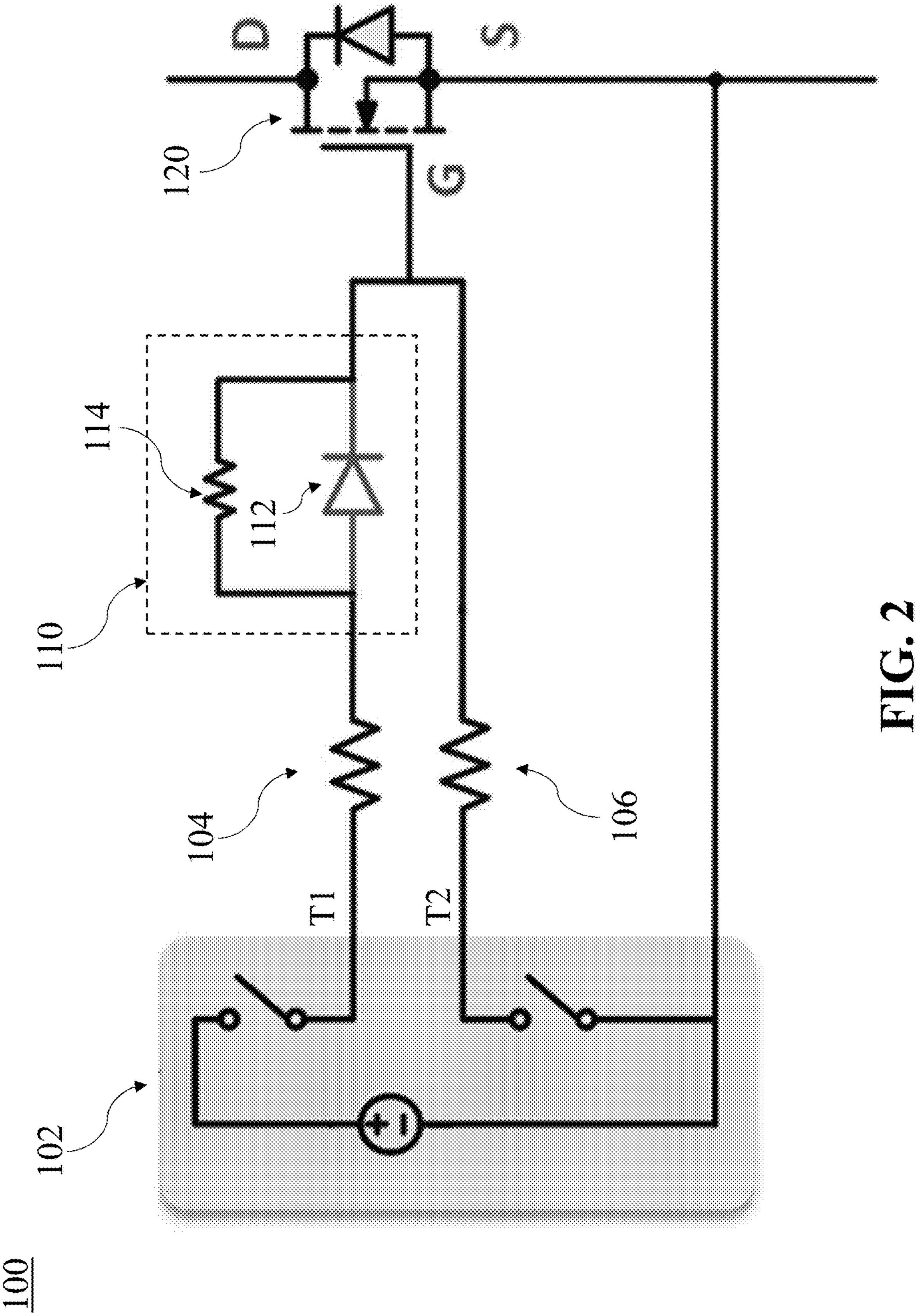
FIG. 2 shows a schematic drawing of a configuration of a dynamic two-step gate driver circuit according to some embodiments of the present invention.

FIG. 2 shows a schematic drawing of a configuration of a dynamic two-step gate driver circuit 100 according to some embodiments of the present invention. The dynamic two-step gate driver circuit 100 includes a driver integrated circuit (IC) 102, a first gate turn-on resistor 104, a gate turn-off resistor 106, a gate protection sub-circuit 110, and a power device 120. The dynamic two-step gate driver circuit 100 is configured to use the driver IC 102 to control the operation of the power device 120. In one embodiment, the power device 120 is a GaN enhancement-mode (E-mode) high-electron-mobility transistor (HEMT), which includes a gate terminal G (e.g., a gate electrode), a source terminal S (e.g., a source electrode), and a drain terminal D (e.g., a drain electrode). The power device 120 functions as a high-speed switching component, driven and controlled by the driver IC 102 for switching operations. In some embodiments, the power device 120 is a GaN/SiC cascode power device. In some embodiments, the power device 120 has a configuration established using one or more GaN HEMTs and one or more GaN/SiC cascode power devices.

The driver IC 102 is configured to generate a desired gate drive signal and transmit it to control the switching process of the power device 120 (e.g., turn-on process). In one embodiment, the driver IC 102 includes several internal components/circuits configured to control the switching process of the power device 120, thereby switching its operation state (e.g., ON or OFF). The driver IC 102 includes a gate turn-on terminal T1 and a gate turn-off terminal T2 for switching the power device 120. Prior to the switching process, the gate terminal G of the power device 120 is to be driven and thus the power device 120 is in an OFF-state.

The first gate turn-on resistor 104 is electrically connected between the gate turn-on terminal T1 of the driver IC 102 and the gate terminal G of the power device 120. The first gate turn-on resistor 104 is configured to limit the current flowing from the driver IC 102 to the gate terminal G of the power device 120 during the turn-on process, which helps control the rise in gate voltage for the power device 120.

The gate turn-off resistor 106 is electrically connected between the gate turn-off terminal T2 of the driver IC 102 and the gate terminal G of the power device 120. The gate turn-off resistor 106 is configured to limit the discharge current from the power device 120 during the turn-off process, thereby controlling turn-off speed of the power device 120.

The gate protection sub-circuit 110 is electrically connected between the first gate turn-on resistor 104 and the gate terminal G of the power device 120. The gate protection sub-circuit 110 includes a diode 112 and a second gate turn-on resistor 114 for controlling the gate voltage of the power device 120 during the turn-on process, maintaining voltage regulation and preventing gate overstress caused by gate voltage overshoot.

Specifically, the diode 112 has an anode electrically connected to the first gate turn-on resistor 104 and a cathode electrically connected to the gate terminal G of the power device 120. The diode 112 facilitates the gate charging current from the gate driver IC 102 to the gate terminal G of the power device 120 and is connected in parallel with the second gate turn-on resistor 114. The second gate turn-on resistor 114 has a resistance value significantly larger than that of the first gate turn-on resistor 104. To regulate the voltage at the gate terminal G of the power device 120, in one embodiment, the diode 112 has a voltage rating higher than the desired gate voltage range of the power device 120 (e.g., the maximum value of the gate voltage range of the power device 120 can be set to be less than the breakdown voltage of the diode 112). Additionally, the diode 112 has a pulsed current rating greater than the set output current from the gate turn-on terminal T1 of the driver IC 102.

The following passages describes the process of charging the gate terminal G of the power device 120 to achieve the turn-on state using the gate protection sub-circuit 110. The process of charging the gate terminal G of the power device 120 to the turn-on state is referred to as a turn-on process, including a first stage and a second stage. In this regard, FIG. 3 and FIG. 4 shows a first stage and a second stage, respectively, of a turn-on process for the dynamic two-step gate driver circuit 100 of FIG. 2 according to some embodiments of the present invention.

Figure 3:
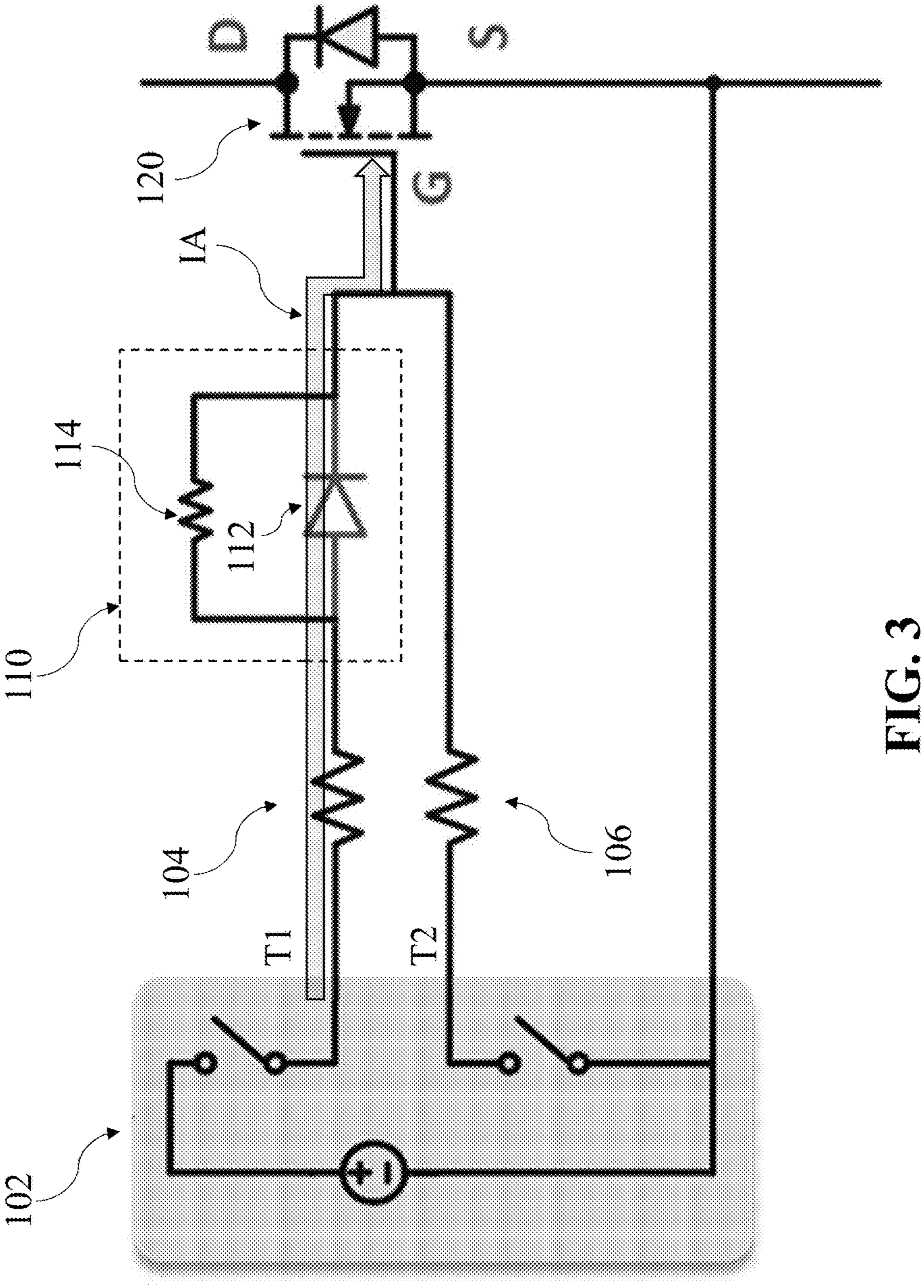
FIG. 3 shows a first stage of a turn-on process for the dynamic two-step gate driver circuit of FIG. 2 according to some embodiments of the present invention.

As shown in FIG. 3, during the first stage of the turn-on process, a high transient gate current IA flows as the driver IC 102 is enabled. The current IA flows from the gate turn-on terminal T1 of the driver IC 102 to the gate terminal G of the power device 120 through the first gate turn-on resistor 104 and the diode 112. Due to the high transient gate current, the diode 112 is turned on and generates a voltage drop across it. This voltage drop reduces the initial gate turn-on voltage applied to the gate terminal G of the power device 120, thereby creating a wider margin to accommodate potential gate voltage ringing. This can reduce the risk of excessive gate voltage overshoot and effectively protect the gate terminal G of the power device 120.

In one embodiment, the diode 112, used for achieving the first stage, can be a GaN-based lateral field-effect rectifier (L-FER) with a relatively high forward voltage drop (e.g., around 2V/approximately 2V, or exactly 2V). In another embodiment, multiple sub-diodes connected in series are used to implement the diode 112, achieving the desired voltage drop (e.g., around 2V/approximately 2V, or exactly 2V). Alternatively, the diode 112 can be implemented using one or more low-voltage GaN HEMTs with the source and gate electrodes shorted.

Figure 4:
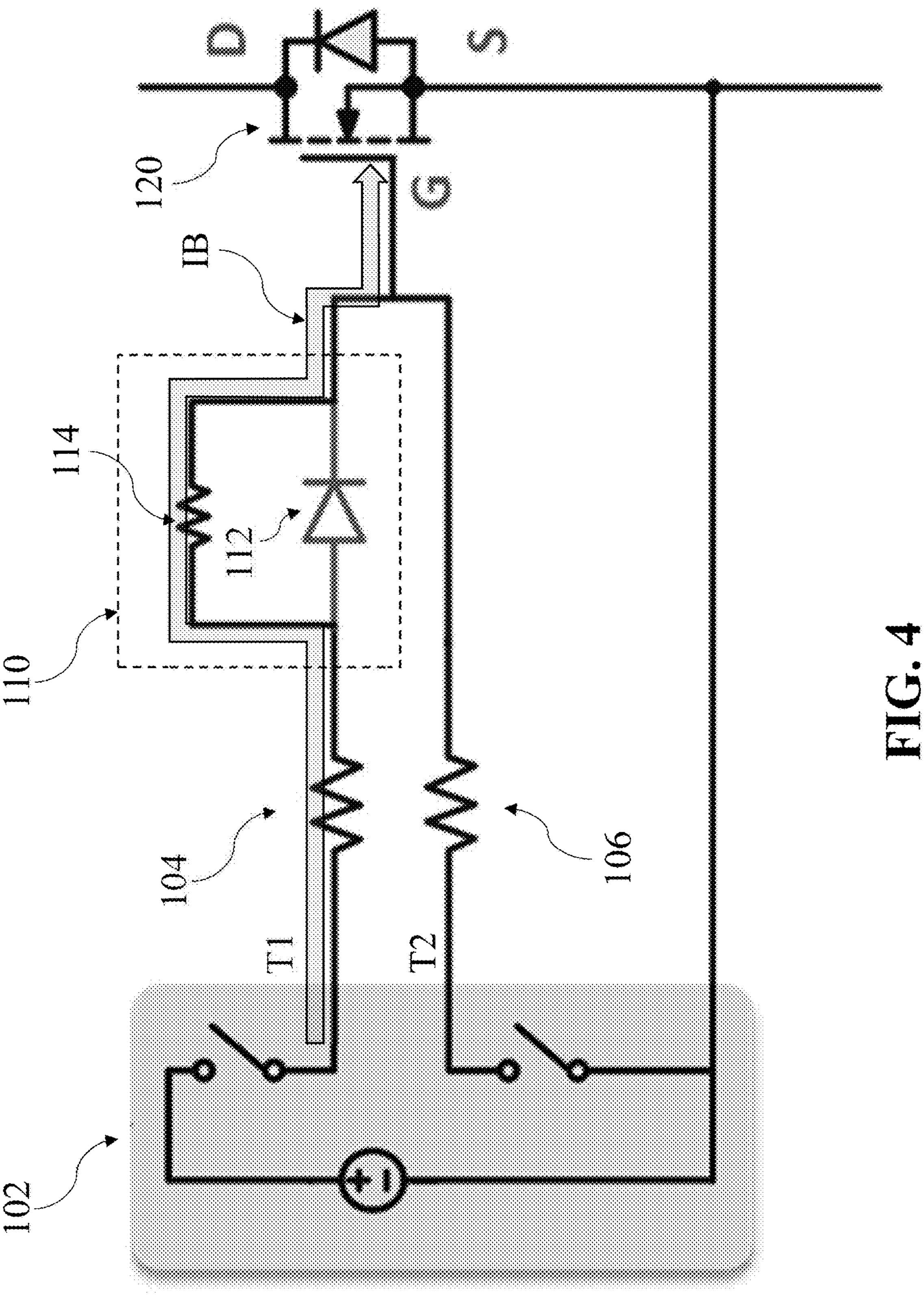
FIG. 4 shows a second stage of the turn-on process for the dynamic two-step gate driver circuit of FIG. 2 according to some embodiments of the present invention.

After the first stage completes, the turn-on process transitions seamlessly into the second stage, as shown in FIG. 4. The gate current IB decreases as the gate terminal G of the power device 120 charges closer to its target voltage. At this point, the diode 112 turns off because the voltage across it drops below its forward turn-on voltage (e.g., 2V for a GaN-based L-FER or the combined forward voltage of the series-connected sub-diodes). Once the diode 112 is off, the remaining gate current IB is redirected/commutated into the parallel-connected second gate turn-on resistor 114. In other words, the gate current IB flows through the second gate turn-on resistor 114 instead of the diode 112.

The second gate turn-on resistor 114 has a much higher resistance compared to the first gate turn-on resistor 104, achieving a slower and more controlled rise in the gate voltage for the power device 120 during the second stage. For example, a ratio of the resistance of the second gate turn-on resistor 114 to the resistance of the first gate turn-on resistor 104 may range from 1 to 100. This gradual increase in gate voltage prevents any potential overshoot while achieving the required voltage to fully turn on the power device 120. By suppressing overshoot and providing smooth voltage elevation, the second stage improves the operational efficiency and reliability of the power device 120.

In some embodiments, the first gate turn-on resistor 104 and the gate turn-off resistor 106 can be tuned to adjust the switching speed of the power device 120 by controlling the rate at which the gate voltage rises and falls. Increasing the resistance of the first gate turn-on resistor 104 slows the charging of the gate terminal G of the power device 120, leading to a slower turn-on time, while decreasing the resistance allows for a faster turn-on. Similarly, adjusting the gate turn-off resistor 106 affects the discharge rate, with higher resistance resulting in slower turn-off and lower resistance enabling faster turn-off. By fine-tuning these resistors, the switching speed can be optimized, balancing efficiency, switching losses, and reducing electromagnetic interference.

In some embodiments, the second gate turn-on resistor 114 is selected to help the gate voltage rising speed of the second turn-on process get slow without overshoot. This is because the rise speed of the gate voltage is directly related to the resistance of the resistor. Choosing a higher gate resistor reduces the current during the charging process, thereby slowing the rise of the gate voltage and making it smoothly reach the desired target voltage without overshoot. The gate voltage overshoot can overstress the gate of the power device to be driven, and threaten the gate reliability and lifetime. By selecting an appropriate value for the second gate turn-on resistor, the gate voltage rise can get controlled, thus enhancing overall efficiency and prolonging the lifespan of the component.

Figure 5B:
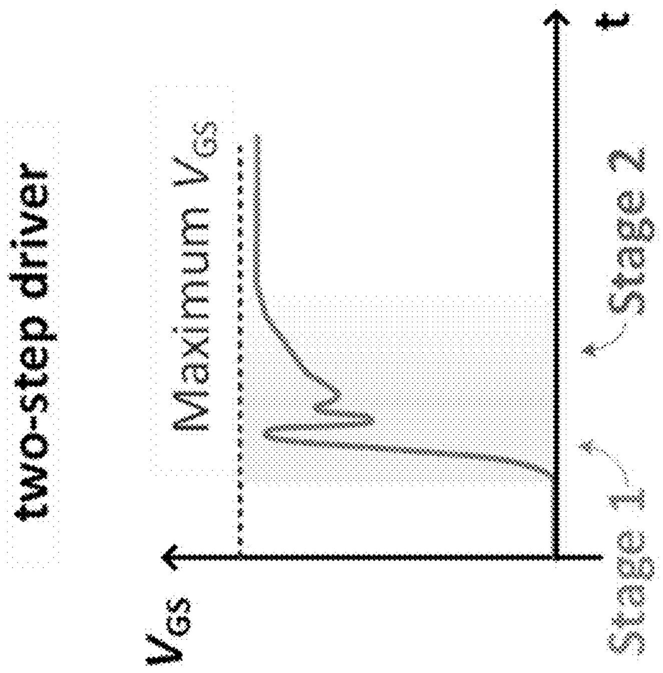
FIG. 5B shows a graph for a turn-on process of a dynamic two-step gate driver circuit according to some embodiments of the present invention.
Figure 5A:
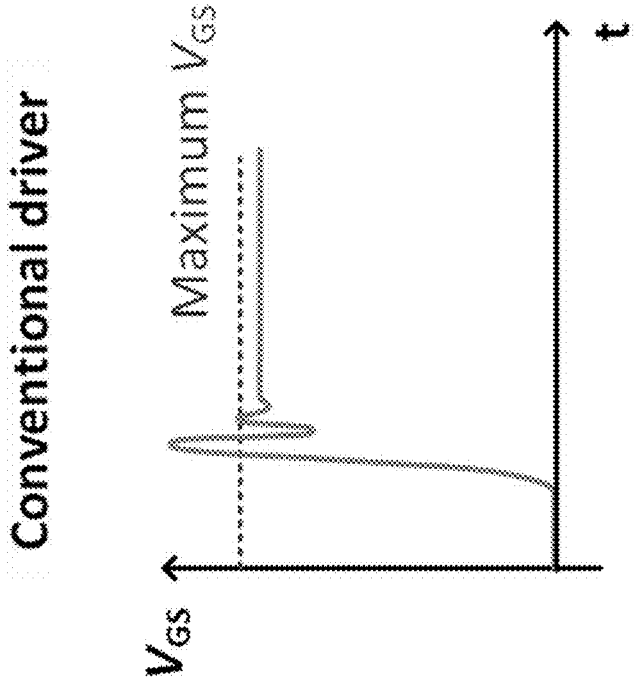
FIG. 5A shows a graph for a turn-on process of a traditional gate driver circuit.

FIG. 5A shows a graph for a turn-on process of a traditional gate driver circuit; and FIG. 5B shows a graph for a turn-on process of a dynamic two-step gate driver circuit according to some embodiments of the present invention. These illustrations demonstrate the gate voltage during the turn-on process of the traditional gate driver circuit and the dynamic two-step gate driver circuit as aforementioned. With the conventional driver circuit, the high gate turn-on voltage narrows the margin to the maximum gate voltage. As a result, gate voltage ringing exceeds the maximum allowable gate voltage, incurring the gate overstress and the associated gate reliability issues. With the dynamic two-step gate driver circuit provided by the present invention, the gate voltage ringing during the fast-switching turn-on process can be accommodated with a wider gate voltage margin of the first stage of the turn-on process. In the second stage of the turn-on process, the large gate resistance (i.e., which is provided by the second gate turn-on resistor) suppresses the gate voltage ringing, and the gate voltage can be elevated to a higher value for the suppression of the conduction loss of the power device to be driven.

Figure 6:
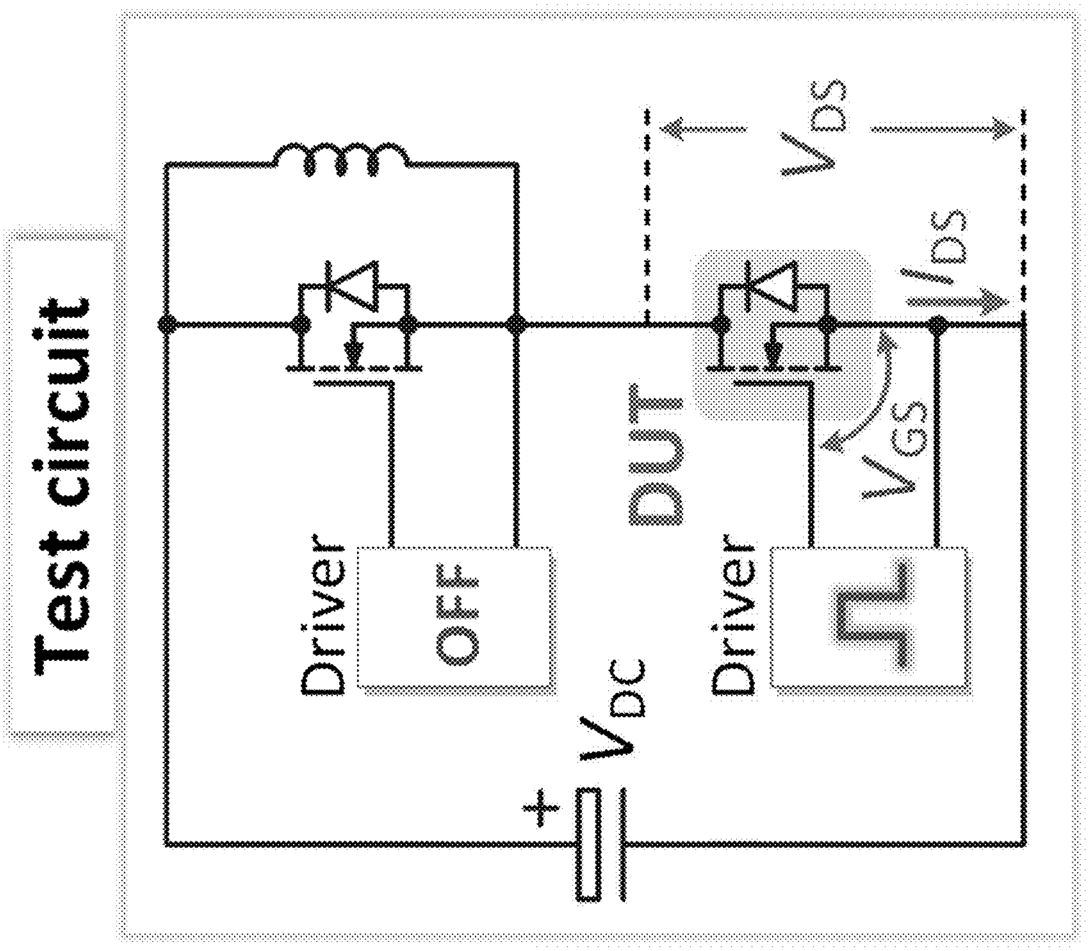
FIG. 6 shows a schematic drawing for a test circuit used to characterize a switching process of a proposed dynamic two-step gate driver circuit according to some embodiments of the present invention.

FIG. 6 shows a schematic drawing for a test circuit used to characterize a switching process of a proposed dynamic two-step gate driver circuit according to some embodiments of the present invention. The 400-V half-bridge circuit based on two 650-V high-voltage GaN HEMTs is used to verify the performance of the dynamic two-step gate driver circuit. The dynamic two-step gate driver circuit is implemented with a 40-V low-voltage GaN HEMT. The source and the gate of the low-voltage GaN HEMT is shorted to realize a L-FER with a forward voltage drop of ~2V when a forward conduction current of around 1 A is flowing through the L-FER.

Figure 7B:
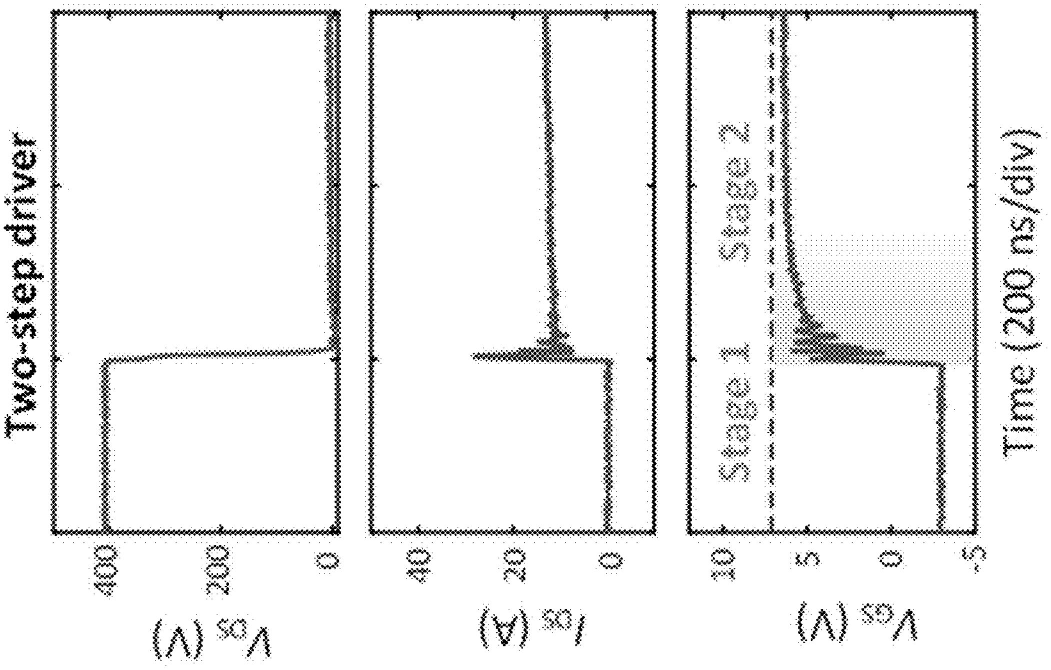
FIG. 7B shows graphs of switching waveforms of a GaN HEMT using a dynamic two-step gate driver circuit during a turn-on process according to some embodiments of the present invention.
Figure 7A:
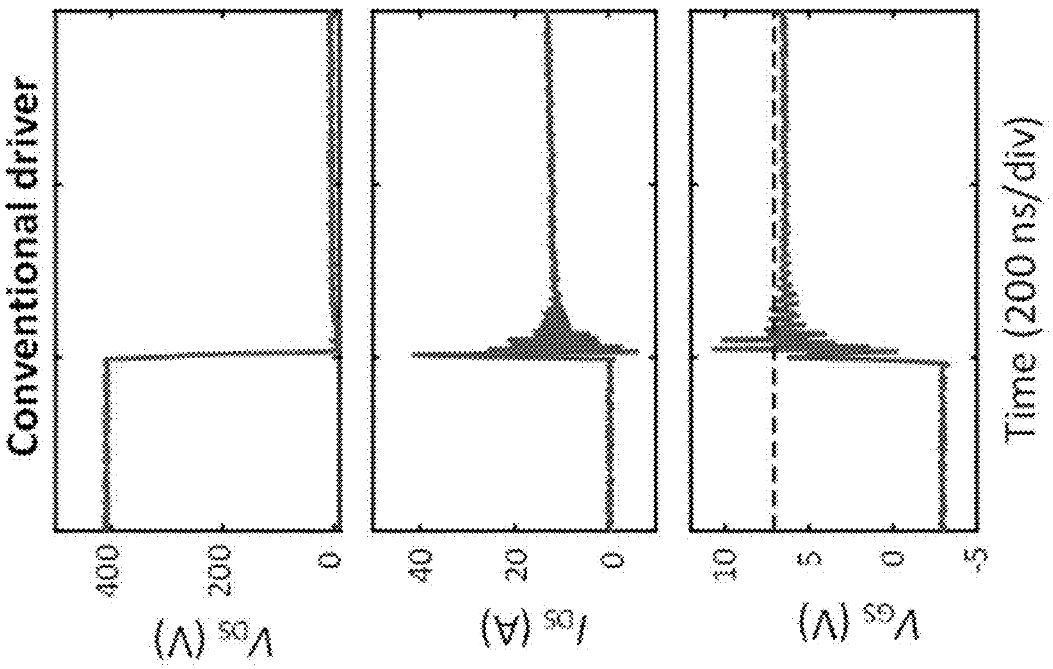
FIG. 7A shows graphs of switching waveforms of a GaN HEMT using a traditional gate driver circuit during a turn-on process.

FIG. 7A shows graphs of switching waveforms of a GaN HEMT using a traditional gate driver circuit during a turn-on process; and FIG. 7B shows graphs of switching waveforms of a GaN HEMT using a dynamic two-step gate driver circuit during a turn-on process according to some embodiments of the present invention. With a conventional gate driver circuit, severe oscillation and gate voltage overshoot are often observed. In contrast, the dynamic two-step gate driver circuit provided by the present invention segments the switching process into two stages. During the first stage, the lower gate turn-on voltage ensures that gate voltage overshoot is suppressed within a safe margin, avoiding gate overstress. Following the fast-switching first stage, the gate voltage of the GaN HEMT is gradually elevated to a higher value during the second stage, effectively reducing conduction loss.

Figure 8A:
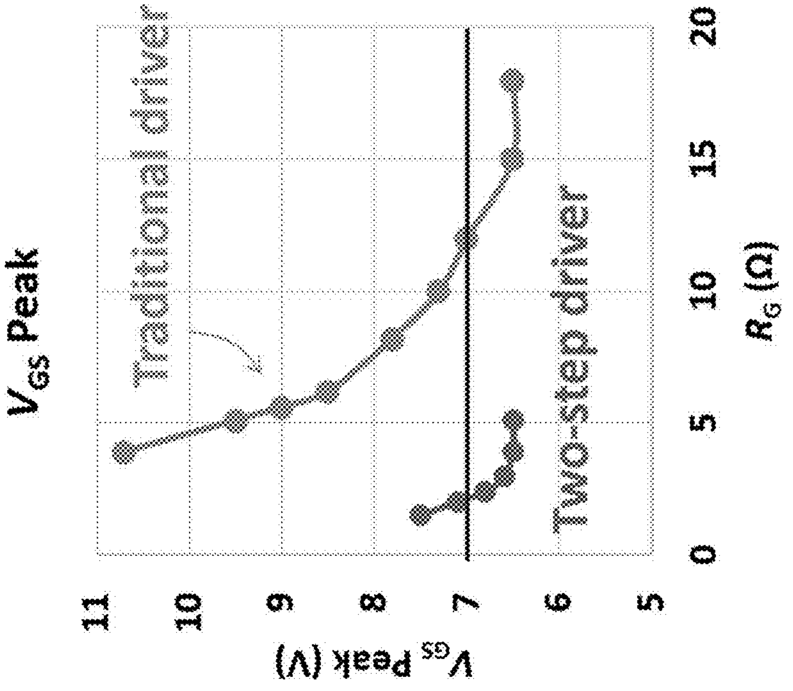
FIG. 8A shows a graph for gate voltage peak of a GaN HEMT during the turn-on process.
Figure 8B:
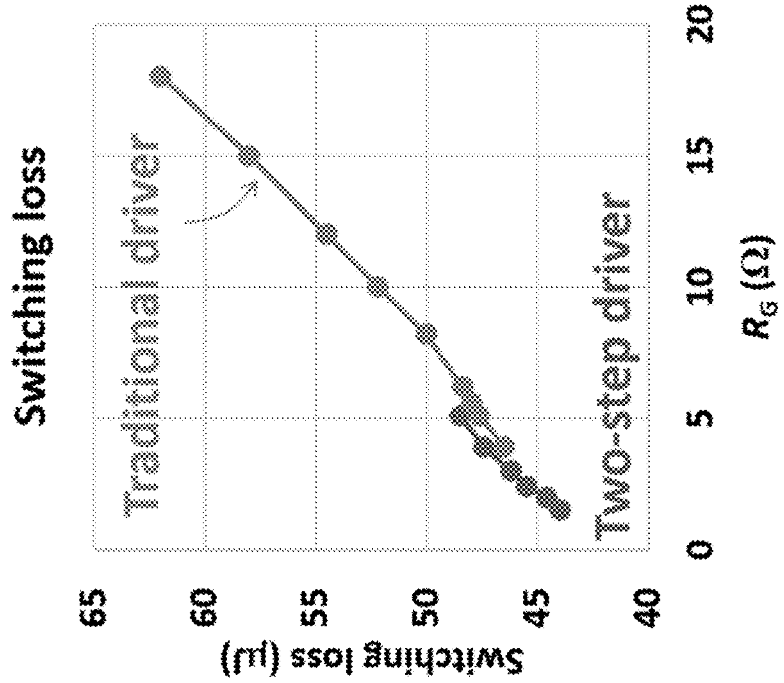
FIG. 8B shows a graph for switching loss of a GaN HEMT during the turn-on process.

FIG. 8A shows a graph for gate voltage peak of a GaN HEMT during the turn-on process; and FIG. 8B shows a graph for switching loss of a GaN HEMT during the turn-on process. With a small gate resistance, the gate voltage peak in a conventional gate driver exceeds the maximum allowable gate voltage of the power device, resulting in gate overstress and associated reliability issues. In contrast, the dynamic two-step gate driver provided by the present invention significantly reduces the gate voltage peak, allowing a small gate resistance to be used for turning on the power device with much lower switching loss and without causing gate overstress.

Figure 9:
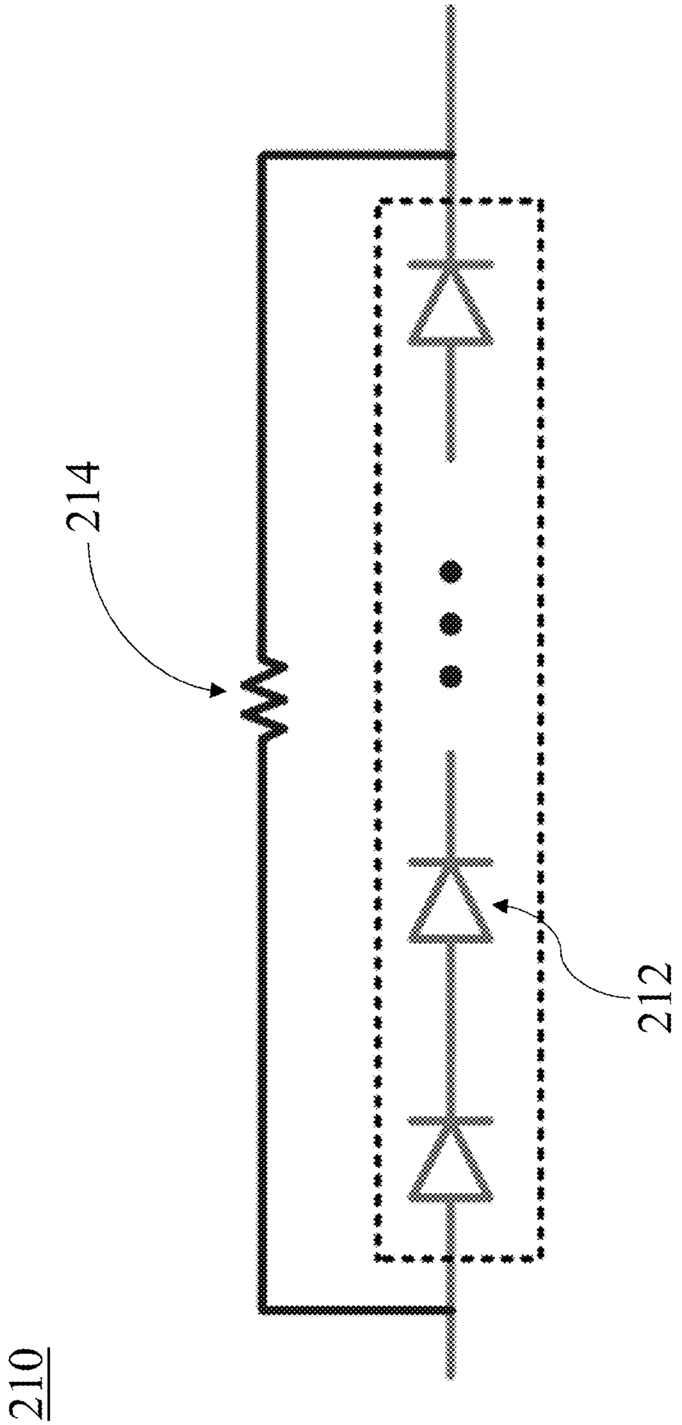
FIG. 9 shows a schematic drawing of a configuration of a dynamic two-step gate driver circuit with several diode connected in series according to some embodiments of the present invention.

FIG. 9 shows a schematic drawing of a configuration of a dynamic two-step gate driver circuit 210 with several diode connected in series according to some embodiments of the present invention. As shown in FIG. 9, the dynamic two-step gate driver circuit 210 may include a plurality of sub-diodes 212 connected in series and a second gate turn-on resistor 214 in parallel with the sub-diodes 212. In one embodiment, the sub-diode 212 are connected in series to realize a higher voltage drop similar to the GaN L-FER. In one embodiment, two or more low-voltage series-connected diodes applied to the configuration of the sub-diode 212.

In some embodiments, the sub-diodes 212 in the dynamic two-step gate driver circuit 210 can be configured to be all identical, partially different, or entirely different. In the configuration where all sub-diodes 212 are different, their forward voltage drops can be arranged/configured to increase or decrease sequentially. This arrangement allows fine-tuning of the gate voltage rise rate, providing better control over the gate voltage transition during the switching process.

Figure 10A:
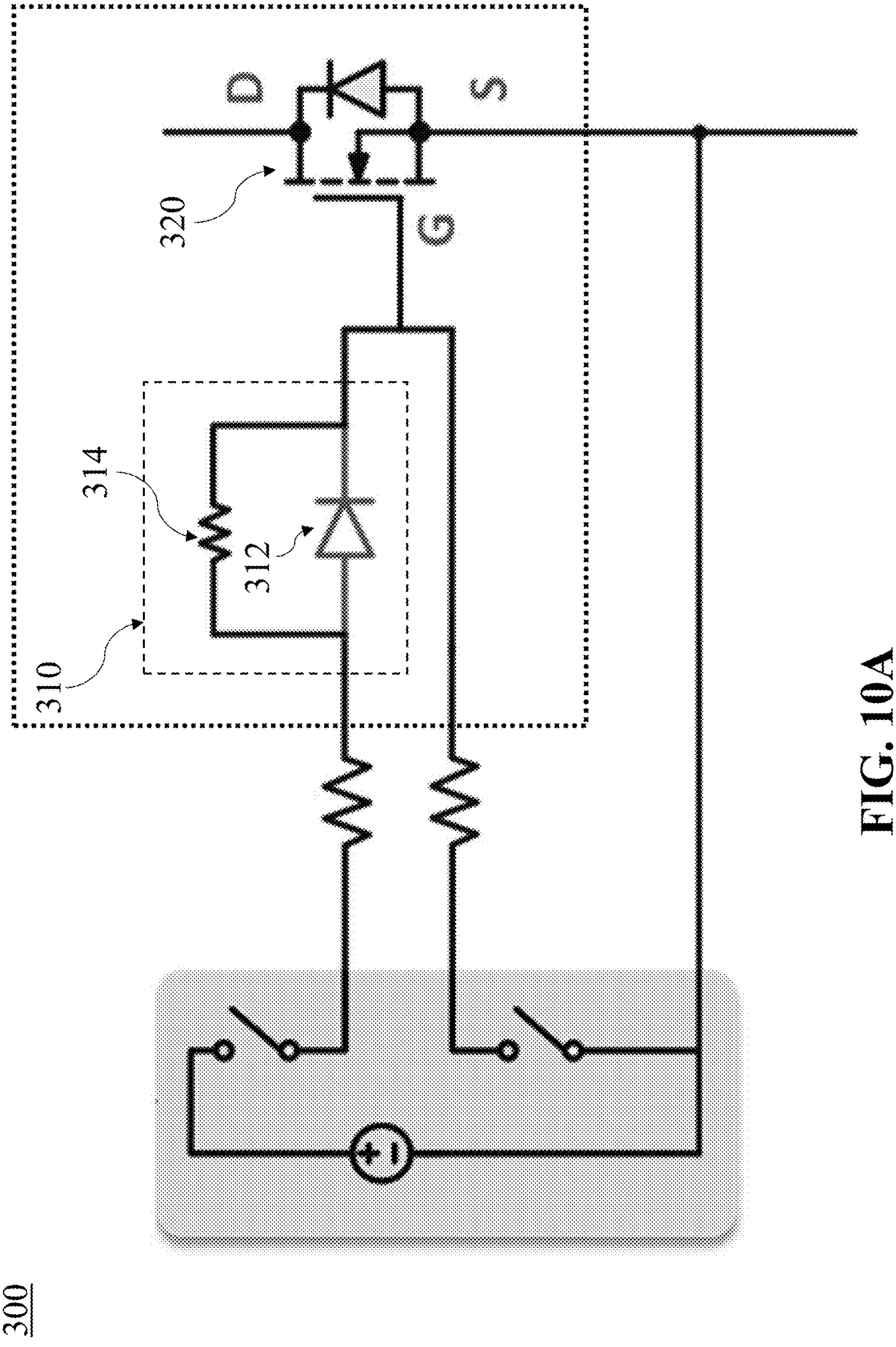
FIG. 10A shows a schematic drawing of a configuration of a dynamic two-step gate driver circuit according to some embodiments of the present invention.

FIG. 10A shows a schematic drawing of a configuration of a dynamic two-step gate driver circuit 300 according to some embodiments of the present invention. The dynamic two-step gate driver circuit 300 has an equivalent circuit arranged similarly to or identical with that of the dynamic two-step gate driver circuit 100, in which the dynamic two-step gate driver circuit 300 includes a diode 312, a second gate turn-on resistor 314, and a power device 320 with of a monolithically integration structure.

To monolithically integrate the diode 312, the second gate turn-on resistor 314, and the power device 320, a shared substrate is applied to their package. For example, the shared substrate includes Si, SiGe, SiC, gallium arsenide, p-doped Si, n-doped Si, sapphire, semiconductor on insulator, such as silicon on insulator (SOI), or other suitable substrate materials. In some embodiments, the shared substrate may include group III elements, group IV elements, group V elements, or combinations thereof (e.g., III-V compounds).

In some embodiments, the diode 312 and the power device 320 are GaN-based components, chosen for their suitability in high-frequency and high-power systems. The power device 320 can be implemented as a GaN HEMT with gate, source, and drain electrodes. The diode 312 can be implemented as a GaN-based L-FER, sharing the same epitaxial layers as the GaN HEMT of the power device 320 to reduce fabrication complexity (e.g., GaN, AlN, AlGaN layers). The source and gate electrodes of the GaN-based L-FER are shorted to provide the required forward voltage drop. The second gate turn-on resistor 314 can be integrated using thin-film resistor materials, such as metal oxides or polysilicon, or by forming high-resistance regions through selective doping or ion implantation. A shared passivation or isolation layer covers the diode 312, the second gate turn-on resistor 314, and the power device 320, providing proper functionality and mitigating interference. Furthermore, a metal interconnection layer may be deposited over the shared passivation or isolation layer to electrically connect the diode 312, the second gate turn-on resistor 314, and the power device 320, thereby minimizing parasitic inductance and resistance. As such, the monolithic integration approach can reduce parasitic effects, improves switching performance, and enables a compact and efficient circuit design.

Figure 10B:
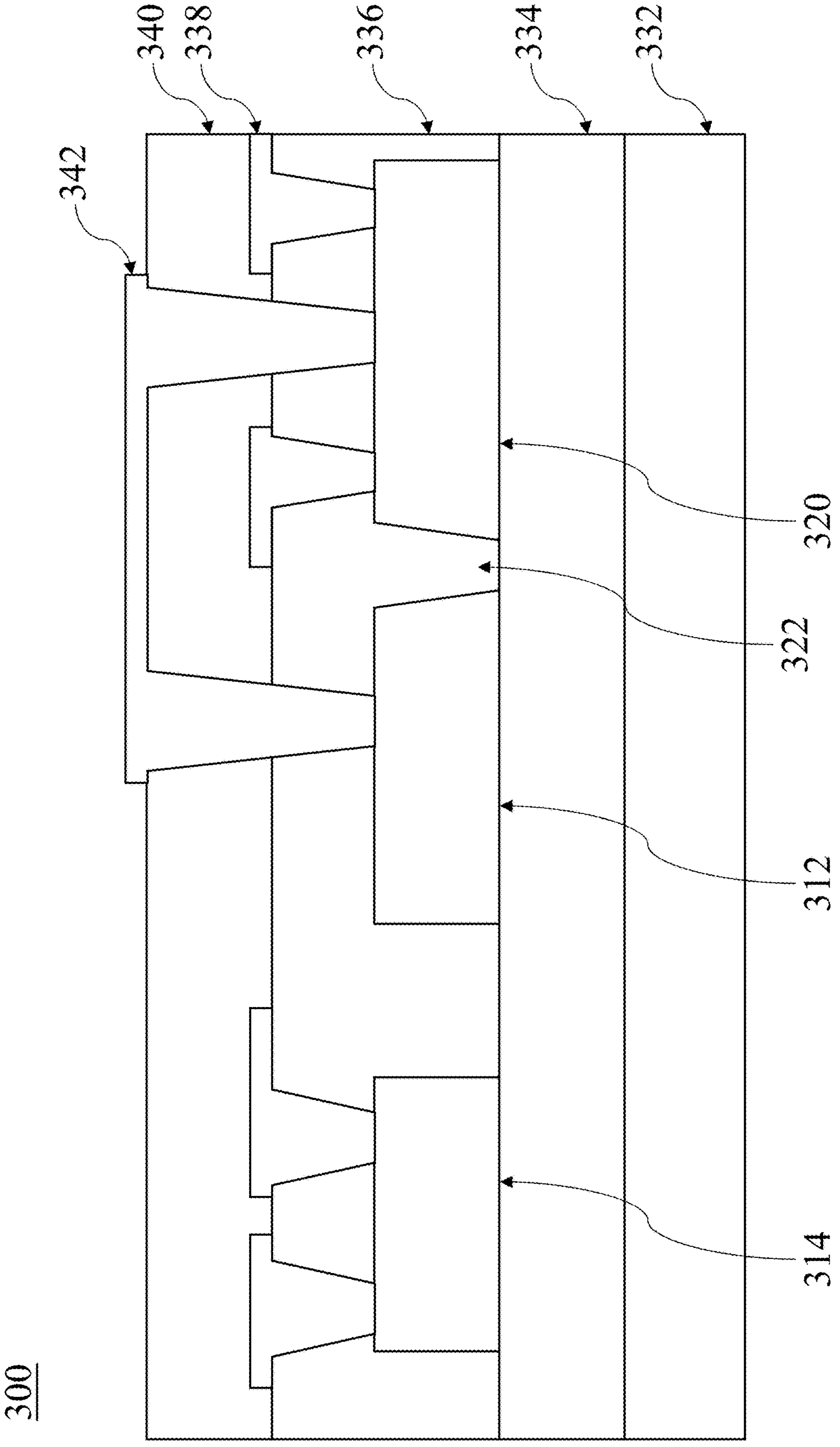
FIG. 10B shows a schematic cross-section of a monolithically integration structure for a diode, a gate turn-on resistor, and a power device according to some embodiments of the present invention.

More specifically, FIG. 10B shows a schematic cross-section of a monolithically integration structure for a diode, a gate turn-on resistor, and a power device according to some embodiments of the present invention. A III-V semiconductor device 330 includes a diode 312, a second gate turn-on resistor 314, a power device 320, a shared substrate 332, an epitaxial layer 334, a first dielectric layer 336, a first interconnection layer 338, a second dielectric layer 340, and a second interconnection layer 342.

The epitaxial layer 334 is disposed over the shared substrate 332. The epitaxial layer 334 may include more than one epitaxial stack, and these epitaxial stacks can have different bandgaps. The diode 312, the second gate turn-on resistor 314, and the power device 320 are disposed over the epitaxial layer 334. The second gate turn-on resistor 314 can be formed using the approaches as aforementioned. The diode 312 and the power device 320 can be formed using one or more epitaxial processes, and then one isolation process is performed to form a gap 322 therebetween. For example, the isolation process includes an etching stage. As such, the diode 312 and the power device 320 may have stacked epitaxial layers with the same compound and the same thickness.

The first dielectric layer 336 covers the diode 312, the second gate turn-on resistor 314, and the power device 320. The first dielectric layer 336 has a portion that fills the gap 322 and is located between the diode 312 and the power device 320. The first interconnection layer 338 is disposed over the first dielectric layer 336 and includes contact vias and metal traces for interconnection among the diode 312, the second gate turn-on resistor 314, and the power device 320. The second dielectric layer 340 covers the first interconnection layer 338, and the second interconnection layer 342 is disposed over the second dielectric layer 340. The second interconnection layer 342 includes contact vias and metal traces for interconnection. For example, the second interconnection layer 342 may have contact vias and metal traces serving as a connection bridge across the gap 322 to electrically connect the diode 312 to the gate electrode of the power device 320. In some embodiments, materials of the dielectric layer may include $SiN_x$, $SiO_x$, SiON, SiC, SiBN, SiCBN, oxides, nitrides, or combinations thereof.

Figure 11:
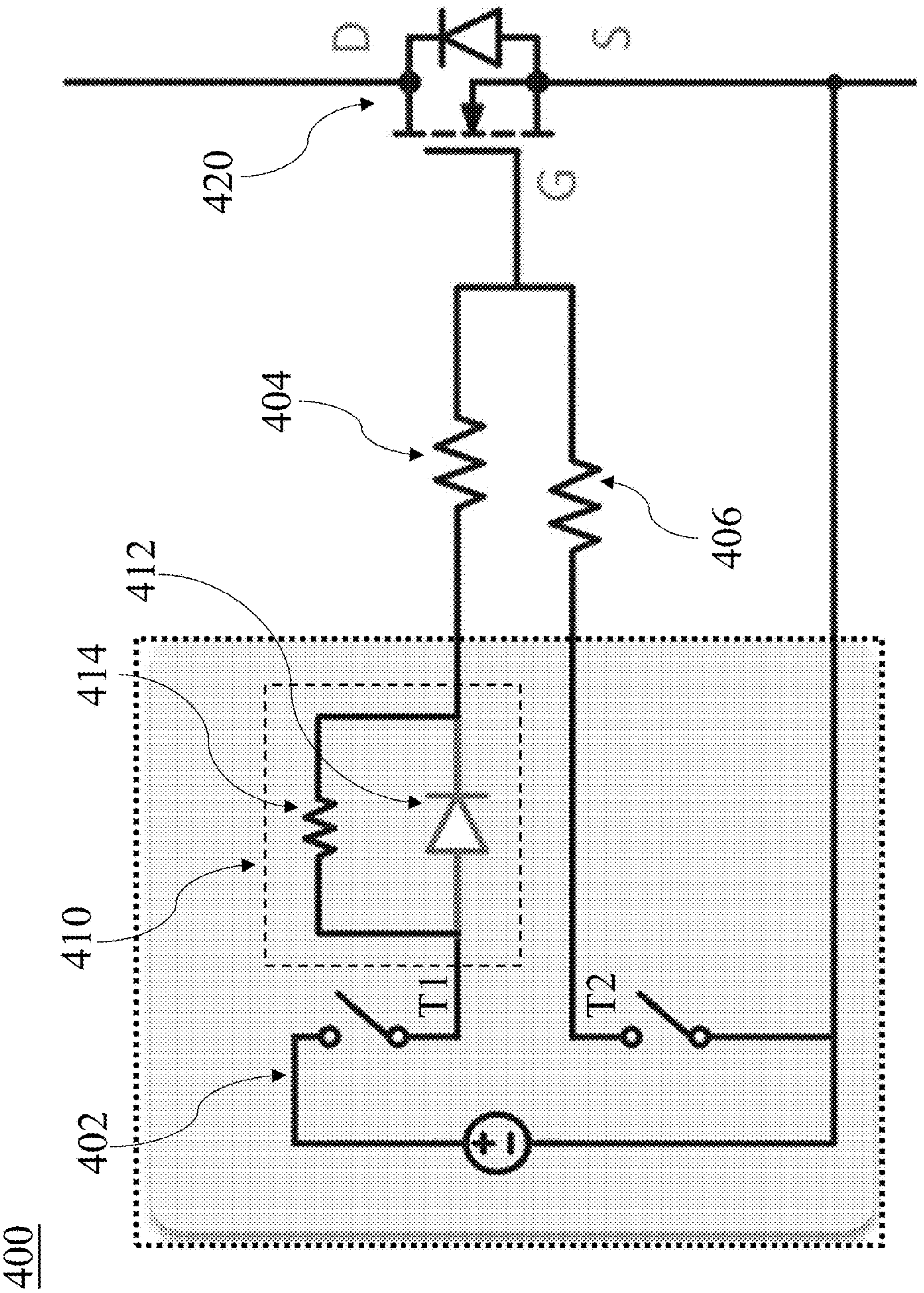
FIG. 11 shows a schematic drawing of a configuration of a dynamic two-step gate driver circuit according to some embodiments of the present invention.

FIG. 11 shows a schematic drawing of a configuration of a dynamic two-step gate driver circuit 400 according to some embodiments of the present invention. The dynamic two-step gate driver circuit 400 includes a driver IC 402, a gate protection sub-circuit 410, a first gate turn-on resistor 404, a gate turn-off resistor 406, and a power device 420.

The driver IC 402 includes a gate turn-on terminal T1 and a gate turn-off terminal T2 for switching the power device 420. The first gate turn-on resistor 404 is electrically connected between the gate turn-on terminal T1 of the driver IC 402 and the gate terminal G of the power device 420. The gate turn-off resistor 406 is electrically connected between the gate turn-off terminal T2 of the driver IC 402 and the gate terminal G of the power device 420.

The gate protection sub-circuit 410 is electrically connected between the gate turn-on terminal T1 of the driver IC 402 and the first gate turn-on resistor 404. The gate protection sub-circuit 410 includes a diode 412 and a second gate turn-on resistor 414 for controlling the gate voltage of the power device 420 during the turn-on process. The diode 412 has an anode electrically connected to the gate turn-on terminal T1 of the driver IC 402 and a cathode electrically connected to the first gate turn-on resistor 404, in which the diode 412 is connected in parallel with the second gate turn-on resistor 414.

The dynamic two-step gate driver circuit 400 is designed with a monolithic integration structure that incorporates a driver IC 402 and the gate protection sub-circuit 410 including the diode 412 and the second gate turn-on resistor 414 on a shared substrate. This shared configuration make all components fabricated simultaneously (e.g., in the same chamber), improving compatibility and reducing manufacturing complexity.

The driver IC 402 is fabricated using processes such as CMOS or GaN-based IC technology, depending on the target application. During the fabrication process for the driver IC 402, the diode 412 and the second gate turn-on resistor 414 are formed using thin-film deposition techniques, such as layering polysilicon or metal oxides, and integrated onto the shared substrate with the driver IC 402. In some embodiments, the diode 412 and the second gate turn-on resistor 414 can be formed using selective doping or ion implantation within predefined regions of the shared substrate, utilizing the same lithographic and etching steps employed for the driver IC 402.

Similarly, a passivation or isolation layer is deposited over the shared substrate after the formation of the driver IC 402, the diode 412, and the second gate turn-on resistor 414, encapsulating all components to protect against environmental factors and electrical interference. Thereafter, a metal interconnection layer is deposited and patterned, creating the electrical pathways between the driver IC 402, the diode 412, and the second gate turn-on resistor 414. By using monolithic fabrication, the driver IC 402, the diode 412, and the second gate turn-on resistor 414 are seamlessly integrated, achieving a compact design.

Spatial references such as "on," "above," "below," and similar terms are defined relative to a component or plane as shown in the figure. These terms are for illustration only and do not limit the actual arrangement, provided the described embodiments retain their intended benefits.

It should be noted that while various structures are depicted as approximately rectangular in the illustrations, their actual shapes may differ in practice due to fabrication conditions. These shapes may include curves, rounded edges, or variations in thickness. The use of straight lines and right angles in the figures is merely a representational convenience for depicting layers and features.

In this disclosure, the terms "a," "an," and "the" should be interpreted to include both singular and plural forms unless explicitly specified otherwise by the context. Additionally, when describing embodiments, a component positioned "on" or "over" another component can refer to cases where the two components are directly in contact or where one or more intermediate components are situated between them.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

What is claimed is:

1. A dynamic two-step gate driver circuit, comprising:
- a power device functioning as a high-speed switching component and having a gate terminal, a source terminal, and a drain terminal;
- a driver integrated circuit (IC) configured to generate a gate drive signal and transmit it to control a switching process of the power device and having a gate turn-on terminal and a gate turn-off terminal;
- a first gate turn-on resistor electrically connected between the gate turn-on terminal of the driver IC and the gate terminal of the power device;
- a gate turn-off resistor electrically connected between the gate turn-off terminal of the driver IC and the gate terminal of the power device; and
- a gate protection sub-circuit electrically connected between the first gate turn-on resistor and the gate terminal of the power device, wherein the gate protection sub-circuit comprises a diode and a second gate turn-on resistor for controlling a gate voltage of the power device during a turn-on process, and wherein the diode has an anode electrically connected to the first gate turn-on resistor and a cathode electrically connected to the gate terminal of the power device and is connected in parallel with the second gate turn-on resistor, wherein the diode, the second gate turn-on resistor, and the power device collectively form a monolithically integration structure, and wherein the monolithically integration structure comprises:
- a shared substrate;
- an epitaxial layer disposed over the shared substrate, wherein the diode, the second gate turn-on resistor, and the power device are disposed over the epitaxial layer;
- a first dielectric layer covering the diode, the second gate turn-on resistor, and the power device; and
- a first interconnection layer disposed over the first dielectric layer and comprising contact vias and metal traces for interconnection among the diode, the second gate turn-on resistor, and the power device.

2. The dynamic two-step gate driver circuit according to claim 1, wherein the power device has a configuration established by a GaN enhancement-mode high-electron-mobility transistor (HEMT), established by a GaN/SiC cascode power device, or established by using one or more GaN HEMTs and one or more GaN/SiC cascode power devices.

3. The dynamic two-step gate driver circuit according to claim 1, wherein the second gate turn-on resistor has a resistance value larger than that of the first gate turn-on resistor.

4. The dynamic two-step gate driver circuit according to claim 3, wherein a ratio of the resistance of the second gate turn-on resistor to the resistance of the first gate turn-on resistor ranges from 1 to 100.

5. The dynamic two-step gate driver circuit according to claim 4, wherein the diode has a voltage rating higher than a set turn-on gate range voltage of the power device.

6. The dynamic two-step gate driver circuit according to claim 5, wherein the diode has a pulsed current rating greater than a set output current from the gate turn-on terminal of the driver IC.

7. The dynamic two-step gate driver circuit according to claim 1, wherein the diode is a GaN-based lateral field-effect rectifier (L-FER).

8. The dynamic two-step gate driver circuit according to claim 1, wherein the epitaxial layer comprises more than one epitaxial stack, and the epitaxial stacks of the epitaxial layer have different bandgaps.

9. The dynamic two-step gate driver circuit according to claim 1, wherein the diode and the power device are separated by a gap therebetween, and the first dielectric layer has a portion that fills the gap and is located between the diode and the power device.

10. The dynamic two-step gate driver circuit according to claim 9, wherein the diode and the power device have stacked epitaxial layers with the same compound and the same thickness.

11. The dynamic two-step gate driver circuit according to claim 9, wherein the monolithically integration structure further comprises:

a second dielectric layer covering the first interconnection layer; and a second interconnection layer disposed over the second dielectric layer and comprising a connection bridge across the gap to electrically connect the diode to the gate terminal of the power device.

12. A dynamic two-step gate driver circuit, comprising:

a power device functioning as a high-speed switching component and having a gate terminal, a source terminal, and a drain terminal;

a driver integrated circuit (IC) configured to generate a gate drive signal and transmit it to control a switching process of the power device and having a gate turn-on terminal and a gate turn-off terminal;

a first gate turn-on resistor electrically connected between the gate turn-on terminal of the driver IC and the gate terminal of the power device;

a gate turn-off resistor electrically connected between the gate turn-off terminal of the driver IC and the gate terminal of the power device; and a gate protection sub-circuit electrically connected between the gate turn-on terminal of the driver IC and the first gate turn-on resistor, wherein the gate protection sub-circuit comprises a diode and a second gate turn-on resistor for controlling a gate voltage of the power device during a turn-on process, and wherein the diode has an anode electrically connected to the gate turn-on terminal of the driver IC and a cathode electrically connected to the first gate turn-on resistor, and the diode is connected in parallel with the second gate turn-on resistor, wherein the diode, the second gate turn-on resistor, and the driver IC collectively form a monolithically integration structure with a shared substrate, and wherein the dynamic two-step gate driver circuit further comprises:

a passivation or isolation layer disposed over the shared substrate and covering the driver IC, the diode, and the second gate turn-on resistor; and a metal interconnection layer disposed over the passivation or isolation layer and comprising electrical pathways electrically connecting the driver IC, the diode, and the second gate turn-on resistor.

13. A dynamic two-step gate driver circuit, comprising:

a power device functioning as a high-speed switching component and having a gate terminal, a source terminal, and a drain terminal;

a driver integrated circuit (IC) configured to generate a gate drive signal and transmit it to control a switching process of the power device and having a gate turn-on terminal and a gate turn-off terminal;

a first gate turn-on resistor electrically connected between the gate turn-on terminal of the driver IC and the gate terminal of the power device;

a gate turn-off resistor electrically connected between the gate turn-off terminal of the driver IC and the gate terminal of the power device; and a gate protection sub-circuit electrically connected between the first gate turn-on resistor and the gate terminal of the power device, wherein the gate protection sub-circuit comprises a diode and a second gate turn-on resistor for controlling a gate voltage of the power device during a turn-on process, and wherein the diode has an anode electrically connected to the first gate turn-on resistor and a cathode electrically connected to the gate terminal of the power device and is connected in parallel with the second gate turn-on resistor, wherein the diode is a GaN-based lateral field-effect rectifier (L-FER).

14. The dynamic two-step gate driver circuit according to claim 13, wherein the power device has a configuration established by a GaN enhancement-mode high-electron-mobility transistor (HEMT), established by a GaN/SiC cascode power device, or established by using one or more GaN HEMTs and one or more GaN/SiC cascode power devices.

15. The dynamic two-step gate driver circuit according to claim 13, wherein the second gate turn-on resistor has a resistance value larger than that of the first gate turn-on resistor.

16. The dynamic two-step gate driver circuit according to claim 15, wherein a ratio of the resistance of the second gate turn-on resistor to the resistance of the first gate turn-on resistor ranges from 1 to 100.

17. The dynamic two-step gate driver circuit according to claim 16, wherein the diode has a voltage rating higher than a set turn-on gate range voltage of the power device.

18. The dynamic two-step gate driver circuit according to claim 13, wherein the diode has a pulsed current rating greater than a set output current from the gate turn-on terminal of the driver IC.

* * * * *